United States Patent

[11] 3,571,724

[72] Inventor Arthur N. Borg
Fort Wayne, Ind.

[21] Appl. No. 733,339
[22] Filed May 31, 1968
[45] Patented Mar. 16, 1971
[73] Assignee Admiral Corporation
Chicago, Ill.

[54] ELECTRICALLY TUNABLE SIGNAL SEEKING TUNER
15 Claims, 5 Drawing Figs.

[52] U.S. Cl. .......... 325/470, 334/15
[51] Int. Cl. .......... H03j 3/00, H03j 3/18, H04b 1/32
[50] Field of Search .......... 325/470; 334/15; 340/347; 307/227, 235, 247, 301

[56] References Cited
UNITED STATES PATENTS

| | | | |
|---|---|---|---|
| 3,020,402 | 2/1962 | Brodsky | 325/470 |
| 3,167,757 | 1/1965 | D'Aquila | 340/347 |
| 3,189,829 | 6/1965 | Bento | 325/470 |
| 3,384,826 | 5/1968 | Schurig | 334/15 |
| 3,414,739 | 12/1968 | Paidosh | 307/301 |
| 3,467,870 | 9/1969 | Aoyama | 325/470 |

OTHER REFERENCES

IEEE, Ninth Communications Symposium Proceedings—1963, pages 106—107, copy in 334/15

*Primary Examiner*—Bernard Konick
*Assistant Examiner*—Howard W. Britton
*Attorney*—Nicholas A. Camasto

ABSTRACT: An all-electronic signal seeking receiver in which a binary counter and a transistorized resistor matrix is utilized to produce an incremental step voltage for reverse biasing a varactor diode included in the tunable circuit of the receiver. The binary counter is started by a flip-flop being driven to its "set" position. Upon receipt of a proper signal, a detector drives the flip-flop to its reset position which stops the binary counter. The transistorized resistor matrix, however, maintains its output voltage at the particular level corresponding to receipt of the signal to maintain the receiver in tune.

Inventor
ARTHUR N. BORG
BY
ATTY.

Inventor
ARTHUR N. BORG
BY Nicholas A Demarco
ATTY

ELECTRICALLY TUNABLE SIGNAL SEEKING TUNER

This invention relates to signal-seeking broadcast receivers in general, and in particular, to all-electronic signal-seeking receivers. Specifically, the invention comprises an all-electronic signal-seeking receiver utilizing a repetitive incremental step voltage produced by an electronic network for reverse-biasing a varactor diode in a tuning circuit. The varactor diode provides a variable capacitance proportional to the voltage applied there across for tuning the circuit and consequently, tuning the receiver to the desired frequency.

Although signal-seeking broadcast receivers are old, their use has not been widespread. Such receivers generally incorporate a manual switch for energizing an electric motor which is drivingly coupled to a movable core in a tuning coil for providing the variable reactance necessary to tune the receiver to various wave signals. Upon receiving one of these wave signals, stopping circuitry generates a stop signal which may, for example, energize a relay for disabling the motor and stopping the core in a selected signal receiving position. Thus, the name signal-seeking or self-seeking is given to receivers of this nature.

Due to the inertia of the rotor, the motor cannot be stopped instantaneously. Consequently, the movable core of the tuning coil may often experience overtravel which could result in detuning of the receiver. The receiver may be broadly tunable, which will help the overtravel problem but will introduce problems of selectivity. A reduction in tuning speed will also help but makes the unit some what inconvenient to operate. Another solution is obviously to make the mechanical arrangement more critical with fast disengaging clutches or the like--all of which represents additional expense.

Another difficulty encountered with conventional self-seeking receivers relates to the dexterity or manual skill demanded of the operator. In most such devices, the start switch bypasses the stopping circuitry (to allow for "quick" tuning across the band). However, it is often desired to tune to a closely adjacent signal and unless considerable manual dexterity is employed, the station will be bypassed. Repetitive tuning to the same signal often results from attempts to momentarily close the switch.

Because of their inertialess properties, nonmechanical tuning elements would seem better suited for signal-seeking receivers than motor-driven tuning coils and the like. One such receiver uses precision-wound inductors and auxiliary windings for providing variable tuning inductance. In this receiver the permeability of the inductor core, and hence the tuning inductance, is proportional to the control current passing through the auxiliary windings and thus, the receiver can be tuned to various wave signals by simply varying the control current. The receiver also includes circuitry for maintaining the control current constant upon receipt of a broadcast signal so that the receiver remains tuned. Here the problem of "overtravel" does not exist.

These precision-wound inductors must display unvarying dynamic characteristics and can be produced only at considerable expense. In addition, such inductor-tuned receivers generally depend on the presence of the broadcast signal to maintain constant control current and hence, a momentary interruption in signal reception may start the receiver "seeking" again.

The present invention is directed to an all-electronic signal-seeking receiver using a varactor diode for providing variable tuning capacitance in response to a reverse-bias step voltage. The varactor diode has accurate and stable electrical properties, is relatively economical, and hence, excellently suited for this application. The invention also includes a novel biasing network, controlled by a flip-flop, for generating the incremental biasing step voltage. The step voltage is essential since it may be readily maintained without elaborate circuitry.

In the circuit incorporating the invention, a start switch drives a flip-flop to its "set" position which energizes the biasing network and initiates generation of the step bias voltage, thereby incrementally changing the capacitance of the varactor diode. These changes in capacity permit the receiver to be incrementally tuned across the frequency tuned across the frequency band. When a broadcast signal is tuned in, circuitry responsive thereto generates a stopping signal for "resetting" the flip-flop, thereby deenergizing the biasing network, which however, maintains its output bias voltage. Since the flip-flop responds instantaneously to the stop signal, no detuning occurs. In addition, operator skill is unnecessary since the flip-flop responds irrespective of the length of time the switch operation, the biasing network cannot be spontaneously energized should the received wave signal be momentarily interrupted.

Thus, the invention obviates the need for expensive tuning elements and operator skill in an electronic signal-seeking receiver. A special feature allows "quick tuning" when desired. Circuitry is also provided for supplementing the bias voltage where a signal is properly tunable between incremental steps in the bias voltage.

Accordingly, the primary object of this invention is to provide an electronic signal-seeking receiver incorporating a varactor diode for supplying tuning capacitance.

Another object of this invention is to provide a novel signal-seeking receiver in which the need for operator skill is minimized.

A further object of this invention is to provide an economical signal-seeking receiver using a varactor diode in which the diode is biased by a cyclical step voltage generated from an electronic counting network.

Still another object of this invention is to provide, in a receiver of the type described, an electronic counter arrangement providing a step function voltage output which may be interrupted at any step to maintain its then existing output.

A feature of this invention resides in circuitry enabling tuning of wave signals which are tunable only between two consecutive voltage steps of the bias step voltage.

Further objects and features of this invention will be apparent upon reading of the following description in conjunction with the accompanying drawings.

Figure 1:
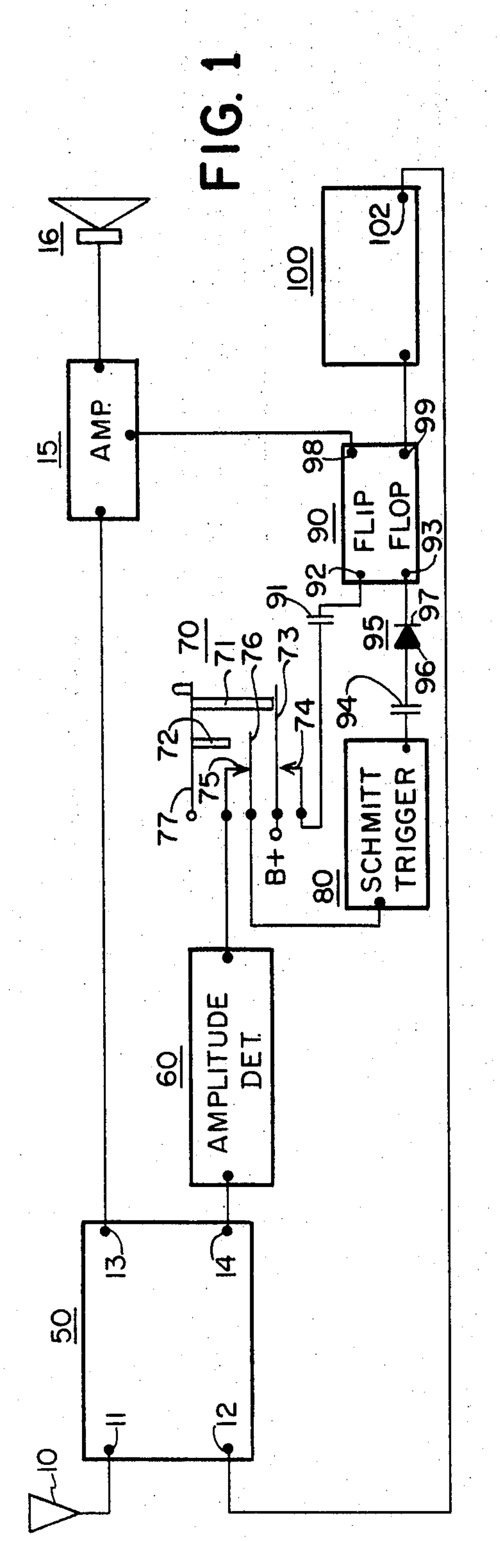
FIG. 1 illustrates a block diagram of an all-electronic signal-seeking receiver in which the present invention is included.

Referring now to FIG. 1, an antenna 10 receives a plurality of wave signals and passes them to be a broadcast tuner 50 having a pair of input terminals 11 and 12, and a pair of output terminals 13 and 14. Tuner 50 contains circuitry for selecting any one of the wave signals within a predetermined frequency band, generating a signal of intermediate frequency and demodulating the selected wave signal. The demodulated signal and the intermediate frequency (IF) signal appear at output terminals 13 and 14, respectively.

An audio amplifier 15, connected to output terminal 13, amplifies the demodulated signal and passes it to a loudspeaker 16 which contains conventional circuitry for reproducing the original sound program material. An amplitude detector 60, coupled to output terminal 14, produces a control voltage, responsive to the presence of the IF signal. When tuner 50 is substantially tuned, the control voltage displays a maximum value.

A multiterminal "start" switch 70 comprises a resilient actuator 77 having two different length insulated plungers 71 and 72 mechanically connected thereto, a set of normally open contacts 73 and 74 and a set of normally closed contacts 75 and 76. Closure of contacts 73 and 74 connects a source B+ voltage through a capacitor 91 to a conventional flip-flop 90. Thus, when actuator 77 is partially depressed, (plunger 71 closing contacts 73 and 74, contacts 75 and 76 remaining closed) a start or "set" voltage is impressed upon the flip-flop through capacitor 91. This produces a momentary pulse which initiates the signal-seeking operation, as will be explained later. Contacts 75 and 76 connect amplitude detector 60 to a normally "off" Schmitt trigger which stops the signal-seeking operation when switched "on." If actuator 77 is depressed further, plunger 72 opens contacts 75 and 76, thereby disconnecting amplitude detector 60 from Schmitt trigger 80. Since the receiver continues "seeking" until Schmitt trigger 80 is switched "on," the receiver bypasses received signals and may be "tuned" across the band.

When Schmitt trigger 80 is "off," it displays substantially zero voltage at its output terminal. When energized by a signal of sufficient strength from amplitude detector 60, it is switched "on," and develops B+ voltage at its output. A capacitor 94, connected to the output of Schmitt trigger 80, produces a voltage pulse, whenever the Schmitt trigger changes its conductive state. A diode 95 having an anode terminal 96 and a cathode terminal 97, is orientated to pass positive polarity voltage pulses and block signals of negative polarity.

Flip-flop 90, having a pair of input terminals 92 and 93 and a pair of output terminals 98 and 99, is coupled to cathode 97 of diode 95 at input terminal 93. Flip-flop 90, in its normally "reset" condition, displays B+ voltage at output terminal 98 and zero voltage at output terminal 99. When in its "set" condition, flip-flop 90 displays zero voltage at output terminal 98 and B+ voltage at output terminal 99. When B+ voltage is connected, through start switch 70, to input terminal 92 of flip-flop 90, the flip-flop changes from its normally "reset" state to its "set" state, and thus, the B+ voltage is commonly called the "set" voltage. When a positive voltage pulse is produced by capacitor 94, the flip-flop switches from its "set" state to its "reset" state, and thus, the positive pulse is commonly called the "reset" voltage. As will be seen, the "set" voltage represents a start signal and the "reset" voltage represents a stop signal.

Output terminal 98 is coupled to amplifier 15, energizing the amplifier with B+ voltage when flip-flop 90 is "reset," thereby permitting sound to be reproduced by loudspeaker 16. When flip-flop 90 is "set," however, output terminal 98 is at zero volts and amplifier 15 is deenergized. Hence, a muting condition is achieved.

Output terminal 99 is coupled to a biasing network 100 which automatically generates a repetitive step voltage of 256 discrete increments when flip-flop 90 is "set," The step voltage appears at biasing terminal 102 and is coupled to tuner 50 at input terminal 12, where tuning circuitry therein enables the tuner to selectively tune the plurality of wave signals appearing at antenna 10.

Figure 2:
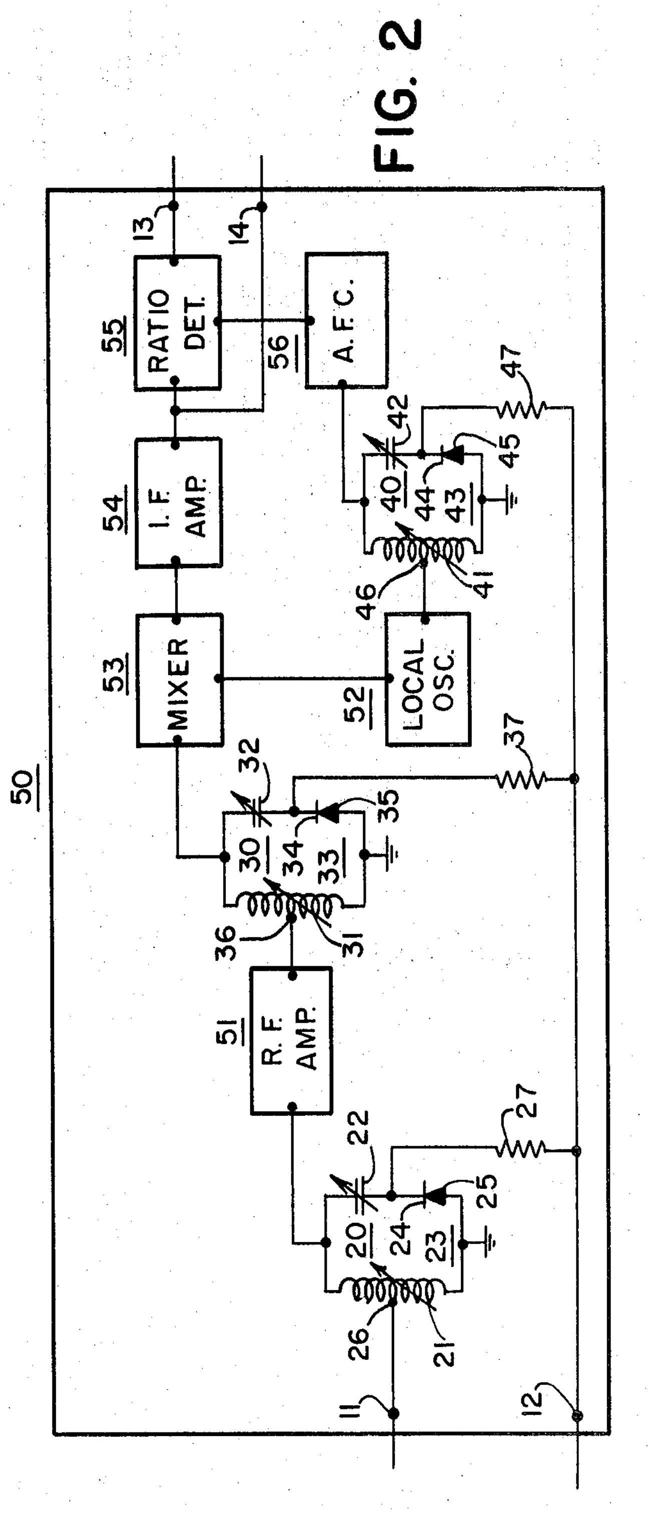
FIG. 2 illustrates a combination block-circuit diagram of the broadcast tuner represented by block 50 in FIG. 1.

Referring now to FIG. 2, tuned circuits 20 comprises an inductor 21, a variable capacitor 22 and a varactor diode 23, which includes a cathode terminal 24 and an anode terminal 25. Varactor diode 23 provides capacitance proportional to the reverse-bias voltage applied thereacross. Capacitor 22 is connected to varactor diode 23 at cathode terminal 24. Variable inductor 21, having a tap 26, is parallelly coupled to the series combination of capacitor 22 and varactor diode 23. Tuned circuit 20 is coupled to antenna 10 at tap 26, and to a point of zero reference potential, hereafter referred to as ground, at anode terminal 25. A resistor 27 is coupled between cathode terminal 24 and input terminal 12. Capacitor 22 is set to permit tuned circuit 20 to select wave signals within a predetermined frequency band.

A conventional transistorized RF amplifier 51 is coupled to tuned circuit 20 at the junction of inductor 21 and capacitor 22. A tuned circuit 30, having the same configuration as tuned circuit 20, comprises a variable inductor 31 including a tap 36, a variable capacitor 32 and a varactor diode 33, having a cathode terminal 34 and an anode terminal 35. A resistor 37 is coupled between cathode terminal 34 and input terminal 12. RF amplifier 51 amplifies the wave signal selected by tuned circuit 20 and passes it to tap 36, of tuned circuit 30. A mixer 53 is coupled to tuned circuit 30 at the junction of inductor 31 and capacitor 32.

A tuned circuit 40, also of the same configuration as tuned circuit 20, includes a variable inductor 41 having a tap 46, a variable capacitor 42 and a varactor diode 43 having a cathode terminal 44 and an anode terminal 45. A resistor 47 is coupled between cathode terminal 44 and input terminal 12. A local oscillator 52 is coupled to tap 46 of tuned circuit 40. Tuned circuit 40, being jointly tunable with both tuned circuits 20 and 30, causes oscillator 52 to generate a signal of such frequency that, when combined with the RF signal from the RF amplifier, a signal of fixed intermediate frequency results. Capacitor 42 is set to maintain this conventional heterodyning action.

An IF amplifier 54, coupled to mixer 53, amplifies the IF signal and couples it to both a ratio detector 55 and output terminal 14. Ratio detector 55 demodulates the amplified IF signal and passes the recovered audio information to output terminal 13.

Ratio detector 55 also supplies a conventional automatic frequency control circuit (AFC) 56 with a feedback signal, the magnitude of which is proportional to the frequency difference between the actual IF signal and the midband frequency to which IF amplifier 54 is tuned. AFC 56 may be conventional and thus include a disabling switch for allowing the receiver to be tuned to signals ordinarily too weak to be "locked in." In addition, since the incremental nature of the biasing voltage generated in bias network 100 changes the capacity of the varactor diode in discrete amounts, inaccurate or unstable tuning may result whenever the frequency of the selected wave signal lies between two increments. With AFC 56 enabled, however, an effective reactance, proportional to the magnitude of the feedback signal, is coupled to oscillator 52 which changes its oscillatory frequency to produce a corrected IF signal corresponding more closely to the midband frequency of IF amplifier 54.

Though the value of the tuning components herein described varies with the particular frequency band selected, the inventive concept remains the same. It should be noted, however, that the variable inductor and variable capacitor referred to in tuned circuits 20, 30 and 40 require special adjustment to maintain interstage tracking when the conventional AM frequency band is chosen, due to the relatively high ratio between maximum and minimum AM frequencies. Since this ratio is considerably less in the FM band, such adjustments are found to be unnecessary.

Figure 3:
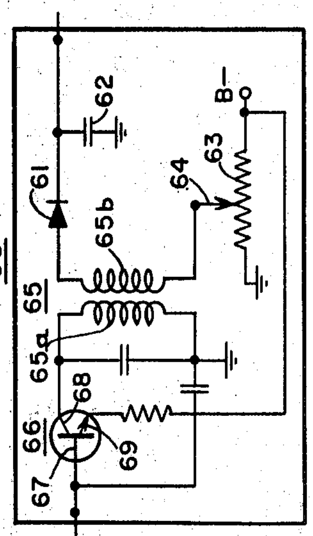
FIG. 3 illustrates a circuit diagram of the amplitude detector represented by block 60 in FIG. 1.

Referring now to FIG. 3, amplitude detector 60 includes a transistor 66 having a base 67, a collector 68 and an emitter 69, a transformer 65 having a primary winding 65*a* and a secondary winding 65*b*, a detector diode 61, a capacitor 62 and a tapped resistor 63. One end of secondary winding 65*b* is connected to diode 61 and the other end is connected to a tap 64 on resistor 63, which is coupled between a source of B− voltage and ground. One end of primary winding 65*a* is connected to collector 68 and the other end is grounded. Emitter 69 is resistively connected to B− and base 67 is connected to output terminal 14 of tuner 50.

Transistor 66 amplifies the IF signal produced by tuner 50 and couples it, through transformer 65, to diode 61 for detection. Capacitor 62 filters the detected IF signal to develop a DC signal, hereinafter referred to as the control voltage. As tuner 50 is tuned toward a particular wave signal, the amplitude of the IF signal increases, reaching a maximum value when the wave signal is accurately tuned.

Tap 64 serves as a threshold control in that it determines the amount of back bias applied to diode 61. This back bias must be exceeded by the IF signal before diode 61 is driven conductive. Therefore "weak" signals will not result in a control voltage being developed and will not be "tuned in." In practice, the threshold control is set to discriminate against signals too weak to provide noise free reception.

As the IF signal increases in magnitude, it reaches the threshold level predetermined by tap 64. When the IF signal exceeds this threshold level, diode 61 conducts and a control voltage is coupled to Schmitt trigger 80 to switch its conductive condition, thereby stopping the seeking action of tuner 50.

Figure 4:
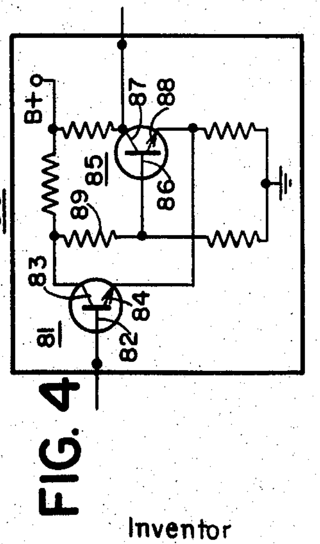
FIG. 4 illustrates a circuit diagram of the Schmitt trigger represented by block 80 in FIG. 1.

Referring now to FIG. 4, a conventional Schmitt trigger includes a transistor 81, having a base 82, a collector 83, an emitter 84 and a transistor 85, having a base 86, a collector 87 and an emitter 88. Collectors 83 and 87 are connected to a source of B+ voltage through a first and a second biasing resistor, respectively. Collector 83 is connected through a resistor 89 to base 86 and thence through another resistor to ground. Emitter 84 is connected to emitter 88 which is connected to ground through a resis . Since transistor 81 is normally cutoff, a positive voltage appears at base electrode 86, and transistor 85 is driven into saturation. Thus, the potential of collector 87 is at a minimum and Schmitt trigger 80 is in its "off" state. When a voltage signal of sufficient strength is passed to base 82, transistor 81 becomes saturated and collector 83 falls to its minimum potential, driving base 86 in a negative direction, thereby cutting transistor 85 off. Schmitt trigger 80 then switches to its "on" state with B+ appearing at collector 87.

When the Schmitt trigger is switched "on," capacitor 94 responds to the abrupt change in voltage at collector 87, producing the "reset" voltage which stops the "seeking" action of the tuner. In the chosen embodiment, the Schmitt trigger is turned "on" only in response to the regeneration of the control voltage by amplitude detector 60. Since the amplitude detector normally regenerates the control voltage only after one wave signal is detuned and another is selected, repetitive tuning is minimized.

Figure 5:
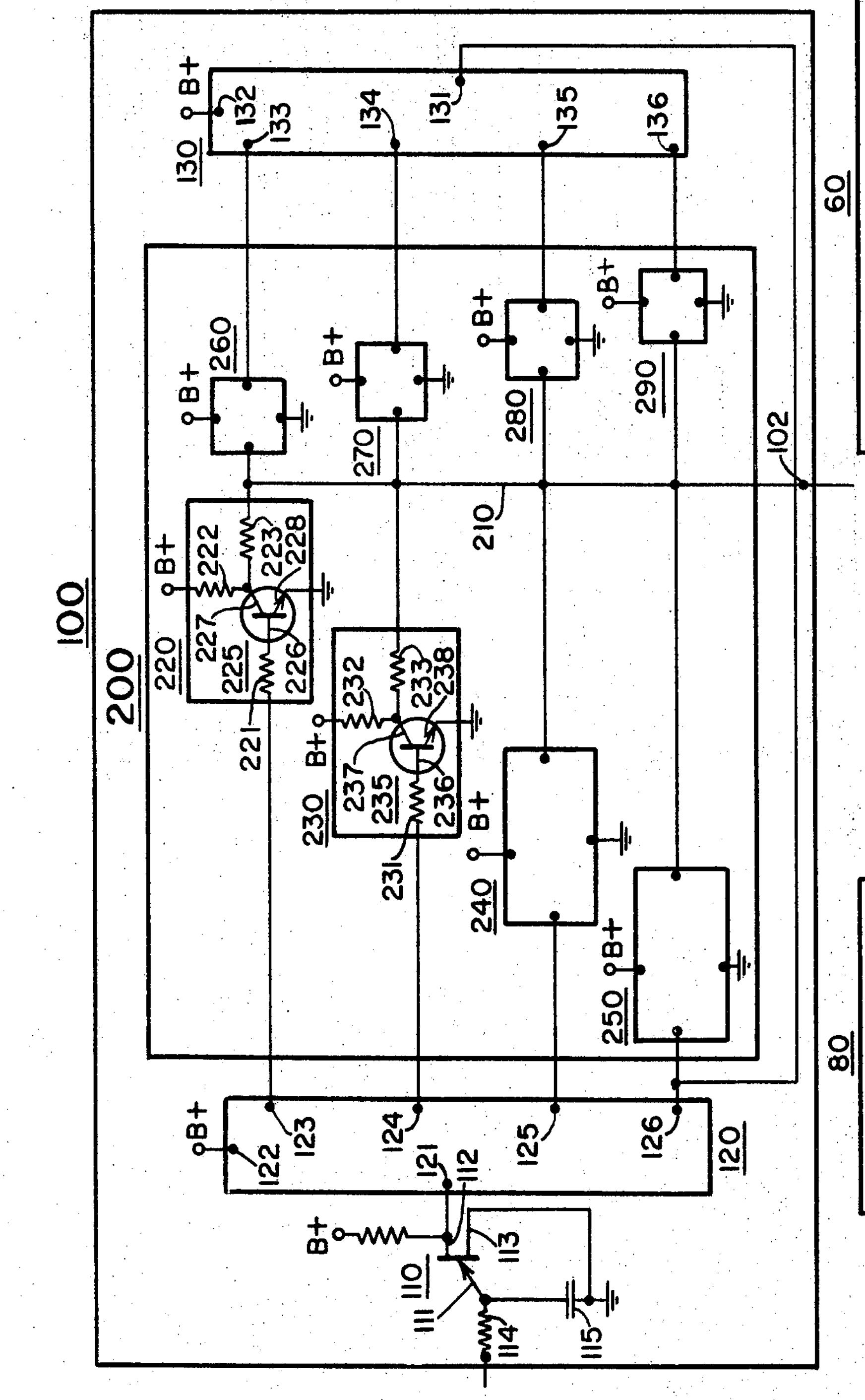
FIG. 5 illustrates a partial circuit diagram of the biasing network represented by block 100 in FIG. 1.

Referring now to FIG. 5, biasing network 100 includes a unijunction transistor 110, having an emitter electrode 111, a first base electrode 112 and a second base electrode 113. Emitter electrode 111 is coupled to output terminal 99 of flip-flop 90, through a resistor 114. Base electrode 112 is coupled through a biasing resistor to a source of B+ voltage, and base electrode 113 is grounded. A capacitor 115 is connected between emitter electrode 111 and ground. Emitter electrode 111 receives an energizing voltage when flip-flop 90 is in its "-set" state, charging capacitor 115 through resistor 114 and raising the potential of emitter electrode 111 until unijunction transistor 110 is switched "on." When the unijunction transistor is switched "on," base electrode 112 is effectively grounded, capacitor 115 discharges and base electrode 112 is returned to B+. The successive charging and discharging of capacitor 115 causes unijunction transistor 110 to produce a train of voltage pulses at base electrode 112 when flip-flop 90 is "set."

A first binary counter 120, having an input terminal 121, a B+ terminal 122 and output terminals 123, 124, 125 and 126, is connected to base electrode 112 of unijunction transistor 110. Binary counter 120 counts the consecutive voltage pulses received at terminal 121 and displays the integers in binary form at its output terminals 123 through 126 in a conventional manner. When binary counter 120 counts to its maximum capacity (the decimal count of 15) it registers clear and the counting cycle is repeated in a well-known manner.

A second binary counter 130, having an input terminal 131, a B+ terminal 132 and output terminals 133, 134, 135 and 136, counts the voltage pulses present at terminal 131 and similarly, displays the integers in binary form at its output terminals 133 through 136. Input terminal 131 is coupled to the most significant output terminal (126) of binary counter 120 such that it receives a voltage pulse each time binary counter 120 counts to its maximum capacity. When binary counter 130 counts to its maximum capacity, it registers clear and its counting cycle is also repeated. As a result, the combination of binary counters 120 and 130 permit binary representation of all integers between 1 and 255 inclusive.

An electronic matrix 200 includes a first electronic array 220 comprising a transistor 225 including a base 226, a collector 227 and a grounded emitter 228. A loading resistor 221 is coupled between base 226 and output terminal 123 of binary counter 120. A biasing resistor 222 is coupled between a source of B+ voltage and collector 227. A summing resistor 223 is coupled between collector 227 and a common lead 210, connected to bias terminal 102.

Electronic matrix 200 also includes a second electronic array 230, comprising a transistor 235 including a base 236, a collector 237 and a grounded emitter 238. A loading resistor 231 is coupled between base 236 and output terminal 124 of binary counter 120. A biasing resistor 232 is coupled between collector 237 and a source of B+ voltage and a summing resistor 233 is coupled between collector 237 and common lead 210.

Electronic matrix 200 further includes electronic arrays 240 through 290, each having the same configuration as electronic arrays 220 and 230. Electronic arrays 240 and 250 are coupled respectively between output terminals 125 and 126 of binary counter 120, and common lead 210. Electronic arrays 260 through 290 are respectively coupled between output terminals 133 through 136 of binary counter 130, and common lead 210.

Under normal conditions, i.e. with zero count, output terminals 123 through 126 of binary counter 120 and output terminals 133 through 136 of binary counter 130 are at B+ potential and hence all transistors in electronic arrays 220 through 290 are in saturation causing the summing resistors 223, 233... to be essentially at ground potential (through emitter electrodes 228, 238...respectively). Thus, common lead 210 is at ground potential and zero bias appears at bias terminal 102.

When the first voltage pulse is impressed upon input terminal 121, terminal 123, being the least significant binary output terminal, is switched from B+ to ground while all the other output terminals remain at B+, thereby representing the binary expression for the decimal number "one." Transistor 225 is driven into cutoff and common lead 210 is connected through summing resistor 223 (biasing resistor 222 being negligible) to B+ while being returned to ground through the parallel combination of all remaining summing resistors. In practice, summing resistor 223 is selected to be 1280 kilohms, summing resistor 232, 640 kilohms, and each successive summing resistor one-half the value of the preceding one. Thus, a unit step voltage appears on common lead 210 and at bias terminal 102.

When the second voltage pulse appears at terminal 121, terminal 123 is switched back to B+ returning transistor 225 to its saturated state and terminal 124 is switched to ground driving transistor 235 into cutoff. The remaining output terminals remain at B+, and therefore the binary expression for the decimal number "two" is represented. Common lead 210 is connected to B+ through summing resistor 233 (biasing resistor 232 being negligible) and to ground through the remaining summing resistors via the conductive emitter-base junctions of their respective transistors. Thus, a higher voltage (having a relative magnitude of two units) appears on common terminal 210 and at bias terminal 102.

As unijunction transistor 110 generates successive voltage pulses, an incremental step voltage having 256 discrete steps is impressed upon common lead 210 and hence upon bias terminal 102. It will be recalled that bias terminal 102 is coupled to tuner 50 at input terminal 12 and hence this incremental voltage reverse-biases varactor diodes 23, 33 and 43 in tuned circuits 20, 30 and 40, respectively, to effect tuning thereof.

When actuator 77 of start switch 70 is depressed, contacts 73 and 74 are closed permitting the "set" voltage to be connected to normally "reset" flip-flop 90. The flip-flop immediately assumes its "set" condition causing zero voltage to appear at output terminal 98 and B+ voltage to appear at output terminal 99. The audio amplifier is therefore deenergized preventing audible sound from being reproduced by the loudspeaker.

The biasing network, energized by the B+ voltage appearing at output terminal 99 of the flip-flop, produces the incremental step voltage which is connected to the broadcast tuner. The incremental step voltage reverse-biases the varactor diodes within the tuner in discrete amounts, and tuning commences.

Upon selection of the next wave signal in the frequency band, an IF signal is produced by the tuner and connected to the amplitude detector. When the receiver is substantially tuned, the control voltage is produced and passed through terminals 75 and 76 of switch 70 to the Schmitt trigger. The Schmitt trigger is switched "on" in response to receipt of the control voltage, and a "reset" voltage is then produced. The "reset" voltage immediately returns the flip-flop to its "reset" condition, and output terminal 98 passes B+ voltage to amplifier 15 which in turn energizes the loudspeaker. Output terminal 99 displays zero voltage, deenergizing the biasing network. Thus, the incremental step voltage is maintained at its instantaneous value and therefore the tuner remains in its selected signal receiving condition until actuator 77 of start switch 70 is again depressed.

What has been described is a novel broadcast receiver which allows the benefits of automatic frequency control, muting and "quick tuning" in a signal-seeking system. In addition, the invention is readily adapted to multiplexing and manual tuning features should the consumer so desire. It is obvious that upon study by those skilled in the art, the disclosed invention may be altered or modified without departing from the inventive concept. Therefore, the scope of the protection to be given this invention should not be limited to the embodiment described above, but should be determined by the description of the essence of the invention which appear in the appended claims.

I claim:

1. In an electrically tunable signal seeking receiver, the combination of: tuning means selectively responsive to a plurality of wave signals and including a varactor diode, said varactor diode providing tuning capacitance as a function of bias voltage applied thereacross; detection means coupled to said tuning means producing a control voltage responsive to receipt of any of said wave signals; switching means having a first conductive state and a second conductive state; biasing means coupled between said tuning means and said switching means; said biasing means developing a cyclical voltage, varying incrementally in discrete steps between two predetermined values when said switching means is in said first conductive state; said biasing means maintaining said incremental step voltage at any intermediate value responsive to said switching means being in said second conductive state; and stopping means, coupled between said detection means and said switching means, driving said switching means into said second conductive state responsive to the production of said control voltage, whereby signal-seeking is effected by changing the tuning capacity provided by said varactor diode.

2. The combination as set forth in claim 1, wherein said tuning means includes; RF signal translation means for selecting any of said wave signals; a first tunable circuit, having an inductor in parallel with said varactor diode, coupled to said RF translation means; said first tunable circuit being adjustable to resonate with any one of said wave signals by varying the effective capacity of said varactor diode.

3. The combination as set forth in claim 2, wherein said tuning means further includes; mixing means coupled to said RF signal translation means; oscillating means, coupled to said mixing means, generating a local oscillatory signal; said mixing means producing an IF signal by heterodyne action between selected wave signal and said local oscillatory signal; a second tunable circuit coupled between said oscillating means and said biasing means; said second tunable circuit including a second varactor diode providing tuning capacitance as a function of said incremental step voltage; the frequency of said oscillating means changing as a function of the effective capacity of said second varactor diode.

4. The combination as set forth in claim 3, wherein said tuning means further includes; IF signal translation means coupled to said mixing means; discriminator means, coupled to said IF translation means, producing an error signal in accordance with deviations of said IF signal from the midband frequency of said IF signal translation means; frequency control means, coupled between said discriminator means and said oscillating means, correcting the frequency of said oscillatory signal as a function of said error signal, whereby the frequency of said oscillatory signal is stabilized and said receiver is automatically tunable to any of said wave signals having a carrier frequency within the range defined by the frequencies associated with the discrete steps of said incremental step voltage.

5. The combination as set forth in claim 3, wherein said biasing means include; pulse train means, generating a train of voltage pulses when said switching means is in said first conductive state, and pulse counting means producing said incremental step voltage as a function of said train of voltage pulses.

6. The combination as set forth in claim 5, wherein said pulse train means comprise; a unijunction transistor oscillator having a resistor and a capacitor coupled to its input circuit; said capacitor charging through said resistor when said unijunction transistor is in one of its two operating modes and discharging when said unijunction is in the other of its two operating modes.

7. The combination as set forth in claim 5, wherein said switching means comprises a bistable multivibrator, and wherein said stopping means include a Schmitt trigger having an "on" state and an "off" state; said Schmitt trigger being driven to and held in said "on" state responsive to the presence of said control voltage, and returning to said "off" state whenever said control voltage is interrupted; said bistable multivibrator switching from said first conductive state to said second conductive state in response to said Schmitt trigger being driven to said "on" state.

8. The combination as set forth in claim 5, wherein said pulse counting means comprise; a binary counter consecutively enumerating said voltage pulses in binary form; and binary-to-digital decoding means, responsive to said binary counter, producing said incremental step voltage.

9. The combination as set forth in claim 8, wherein said binary-to-digital decoding means comprise; a transistor matrix responsive to said binary counter; a plurality of resistors selectively energized by said matrix; a plurality of voltages appearing across said resistors upon energization by said matrix; and means for discretely summing said voltages, thereby producing said incremental step voltage.

10. In combination: reception means responsive to a plurality of wave signals; a first tunable circuit, adjustable within a predetermined frequency band to any one of said wave signals, comprising an inductor parallelly coupled to a varactor diode; said varactor diode providing tuning capacitance as a function of bias voltage applied thereacross; a RF signal translation means coupled to said first tunable circuit; a second tunable circuit including a second varactor diode providing tuning capacitance as a function of bias voltage applied thereacross, coupled to said RF translation means; heterodyning means, coupled to said second tunable circuit, producing an IF signal; detection means coupled to said heterodyning means producing a control voltage responsive to receipt of said IF signal; a bistable multivibrator having a first conductive state and a second conductive state; biasing means developing an incremental step voltage when said bistable multivibrator is in said first conductive state; said biasing means maintaining said incremental step voltage at constant value responsive to said bistable multivibrator being in said second conductive state; a Schmitt trigger coupled between said detection means and said bistable multivibrator driving said bistable multivibrator into said second conductive state responsive to the production of said control voltage; said biasing means coupling said incremental step voltage to said first and second tuned circuits, whereby tuning is effected by changing the capacity of said first and second varactor diodes.

11. The combination as set forth in claim 10, further including demodulating means, coupled to said heterodyning means, producing audio information in response to said IF signal; an audio amplifier coupled to said demodulating means; a loudspeaker connected to said amplifier reproducing audible sound material upon energization by said amplifier; said amplifier energizing said loudspeaker when said bistable multivibrator is in said second conductive state and deenergizing said amplifier when said bistable multivibrator is in said first conductive state, whereby a muting condition is effected when said bistable multivibrator is in said first conductive state.

12. The combination as set forth in claim 10, further including normally closed contact means permitting passage of said control voltage to said Schmitt trigger, whereby opening said contact means prevents said control voltage from energizing said Schmitt trigger thereby permitting quick tuning across said frequency band.

13. In combination: pulse means producing a train of electrical pulses; binary counting means, having a plurality of output terminals, coupled to said pulse means; said binary counting means cyclically enumerating said electrical pulses in successive integers, and consecutively displaying each of said integers in binary form at said output terminals; conversion means, coupled to said counting means, converting said integers from binary form to an incremental bias voltage increasing in discrete steps as each of said electrical pulses is enumerated by said counting means; tuning means, coupled to said conversion means, responsive to a plurality of electrical wave signals; said tuning means including a varactor diode, presenting an effective capacitance dependent upon the bias voltage applied thereto, the effective capacitance of said varactor diode being varied in accordance with said incremental bias voltage whereby said tuning means sequentially responds to said plurality of electrical wave signals.

14. The combination as set forth in claim 13, further including; switching means having a first conductive state and a second conductive state; said pulse means being energized when said switching means is in said first conductive state and deenergized when said switching means is in said second conductive state; stopping means driving said switching means into said second conductive state; said conversion means maintaining said incremental step voltage at a constant value when said pulse means is deenergized, whereby said varactor diode displays constant tuning capacitance when said switching means is in said second conductive state.

15. The combination as set forth in claim 14, further including; a tunable circuit comprising an inductor parallelly coupled to said varactor diode, adjustable within a predetermined frequency band for selecting any one of said wave signals; heterodyning means coupled to said tunable circuit, producing an IF signal in response to a selected wave signal; detection means, coupled between said stopping means, and said heterodyning means, producing a control voltage in response to said IF signal, whereby said stopping means causes said switching means to return to its second conductive state upon receipt of said control voltage.